(12) United States Patent
Hao et al.

(10) Patent No.: US 10,224,112 B2
(45) Date of Patent: Mar. 5, 2019

(54) SHIFT REGISTER UNIT, DRIVING METHOD THEREOF, GATE DRIVER CIRCUIT AND DISPLAY DEVICE

(71) Applicant: BOE TECHNOLOGY GROUP CO., LTD., Beijing (CN)

(72) Inventors: Xueguang Hao, Beijing (CN); Jianbo Xian, Beijing (CN); Xinyin Wu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/533,042

(22) PCT Filed: Nov. 4, 2016

(86) PCT No.: PCT/CN2016/104590
§ 371 (c)(1),
(2) Date: Jun. 5, 2017

(87) PCT Pub. No.: WO2017/113984
PCT Pub. Date: Jul. 6, 2017

(65) Prior Publication Data
US 2018/0294040 A1  Oct. 11, 2018

(30) Foreign Application Priority Data

Dec. 31, 2015 (CN) .......................... 2015 1 1029520

(51) Int. Cl.
*G11C 19/28* (2006.01)
*G09G 3/3266* (2016.01)
*G09G 3/36* (2006.01)

(52) U.S. Cl.
CPC ........... *G11C 19/28* (2013.01); *G09G 3/3266* (2013.01); *G09G 3/3677* (2013.01);
(Continued)

(58) Field of Classification Search
CPC .... G11C 19/28; G11C 19/287; G09G 3/3266; G09G 3/3674; G09G 3/3677;
(Continued)

(56) References Cited

U.S. PATENT DOCUMENTS 8,605,027 B2 * 12/2013 Pak ...................... G09G 3/3677
  315/169.2
9,905,155 B2 * 2/2018 Zhang .................. G09G 3/2092
(Continued)

FOREIGN PATENT DOCUMENTS

CN     103413514 A     11/2013
CN     103680636 A      3/2014
(Continued)

OTHER PUBLICATIONS

International Search Report and Written Opinion for Application No. PCT/CN2016/104590, dated Jan. 26, 2017, 13 Pages.

*Primary Examiner* — Patrick O Neill
(74) *Attorney, Agent, or Firm* — Brooks Kushman P.C.

(57) ABSTRACT

A shift register unit, a driving method thereof, a gate driver circuit and a display device are provided. The shift register unit includes a first pull-up node control unit, a second pull-up node control unit configured to enable a pull-up node to be at a first level at a pull-down maintenance stage under the control of a first clock signal, a first pull-down node control unit configured to enable a pull-down node to be at a second level at the pull-down maintenance stage under the control of the first clock signal, a second pull-down node control unit, a gate driving signal output unit configured to output a gate driving signal under the control of the pull-up and pull-down nodes, and a carry signal output unit configured to enable a carry signal output end to output a carry signal under the control of the pull-up and pull-down nodes.

20 Claims, 8 Drawing Sheets

(52) U.S. Cl.
CPC ... *G11C 19/287* (2013.01); *G09G 2310/0286* (2013.01); *G09G 2320/0252* (2013.01)

(58) Field of Classification Search
CPC ... G09G 2310/0283; G09G 2310/0286; G09G 2320/0252
See application file for complete search history.

(56) References Cited

U.S. PATENT DOCUMENTS

| | | |
|---|---|---|
| 9,940,889 B2* | 4/2018 | Park .................. G09G 3/3677 |
| 2012/0051494 A1 | 3/2012 | Yang et al. |
| 2015/0029082 A1* | 1/2015 | Jeon .................. G11C 19/28 345/98 |
| 2016/0019840 A1 | 1/2016 | Cao et al. |
| 2016/0027371 A1 | 1/2016 | Hao et al. |
| 2016/0064098 A1 | 3/2016 | Han et al. |

FOREIGN PATENT DOCUMENTS

| | | |
|---|---|---|
| CN | 103730089 A | 4/2014 |
| CN | 105609135 A | 5/2016 |

\* cited by examiner

SHIFT REGISTER UNIT, DRIVING METHOD THEREOF, GATE DRIVER CIRCUIT AND DISPLAY DEVICE

CROSS-REFERENCE TO RELATED APPLICATION APPLICATIONS

This application is the U.S. national phase of PCT Application No. PCT/CN2016/104590 filed on Nov. 4, 2016, which claims priority to Chinese Patent Application No. 201511029520.6 filed on Dec. 31, 2015, the disclosures of which are incorporated in their entirety by reference herein.

TECHNICAL FIELD

The present disclosure relates to the field of display technology, in particular to a shift register unit, a driving method thereof, a gate driver circuit and a display device.

BACKGROUND

A gate driver circuit applied to a display device includes multiple levels of shift register units. Each shift register unit includes a pull-up node control unit, a pull-down node control unit and a gate driving signal output unit. The pull-up node control unit is connected to a pull-up node and configured to control a potential at the pull-up node. The pull-down node control unit is connected to a pull-down node and configured to control a potential at the pull-down node. The gate driving signal output unit is configured to control the output of a gate driving signal in accordance with the potential at the pull-up node and the potential at the pull-down node. The gate driving signal serves as a carry signal for an adjacent level shift register unit, and thus its response speed is relatively small. In addition, a relatively large drift may occur for a thin film transistor (TFT) as a main element of the shift register unit in the case that a direct current (DC) is applied to the TFT for a long time period or in the case that the TFT operates at a high temperature, so its reliability may be reduced. Further, in the case that the TFT is a polycrystalline silicon TFT, a relatively large leakage current may occur in the case that the TFT is turned off, so the power consumption may increase and even a normal operation of the shift register unit may be adversely affected.

SUMMARY

A main object of the present disclosure is to provide a shift register unit, a driving method thereof, a gate driver circuit and a display device, so as to prevent the occurrence of drift and increase the response speed in the case that the TFT is operated for a long time period or at a high temperature.

In one aspect, the present disclosure provides in some embodiments a shift register unit, including a gate driving signal output end, a carry signal output end, a first clock signal input end, and a carry signal input end. The shift register unit further includes: a first pull-up node control unit connected to a pull-up node and the carry signal input end; a second pull-up node control unit connected to the pull-up node and the first clock signal input end, and configured to enable the pull-up node to be at a first level at a pull-down maintenance stage under the control of a first clock signal; a first pull-down node control unit connected to a pull-down node and the first clock signal input end, and configured to enable the pull-down node to be at a second level at the pull-down maintenance stage under the control of the first clock signal; a second pull-down node control unit connected to the pull-up node and the pull-down node, and configured to enable the pull-down node to be at the first level in the case that the pull-up node is at the second level; a gate driving signal output unit connected to the pull-up node, the pull-down node and the gate driving signal output end, and configured to enable the gate driving signal output end to output a gate driving signal under the control of the pull-up node and the pull-down node; and a carry signal output unit connected to the pull-up node, the pull-down node and the carry signal output end, and configured to enable the carry signal output end to output a carry signal under the control of the pull-up node and the pull-down node.

In a possible embodiment of the present disclosure, the first pull-up node control unit is configured to enable the pull-up node to be at the second level at an input stage under the control of the carry signal, and maintain the pull-up node at the second level at an output stage.

In a possible embodiment of the present disclosure, the carry signal input end includes a first carry signal input end and a second carry signal input end. During forward scanning, the first carry signal input end is connected to a carry signal output end of an adjacent previous-level shift register unit, and during backward scanning, the second carry signal input end is connected to a carry signal output end of an adjacent next-level shift register unit.

In a possible embodiment of the present disclosure, the first pull-up node control unit includes: a first input module connected to the pull-up node and to the carry signal output end of the adjacent previous-level shift register unit via the first carry signal input end, and configured to, during the forward scanning, enable the pull-up node to be at the second level at the input stage under the control of a first carry signal; and a second input module connected to the pull-up node, and to the carry signal output end of the adjacent next-level shift register unit via the second carry signal input end, and configured to, during the backward scanning, enable the pull-up node to be at the second level at the input stage under the control of a second carry signal.

In a possible embodiment of the present disclosure, the first input module includes a first transistor, a gate electrode and a first electrode of which are connected to the carry signal output end of the adjacent previous-level shift register unit via the first carry signal input end, and a second electrode of which is connected to the pull-up node, and the second input module includes a second transistor, a gate electrode and a second electrode of which are connected to the carry signal output end of the adjacent next-level shift register unit via the second carry signal input end, and a first electrode of which is connected to the pull-up node.

In a possible embodiment of the present disclosure, the first pull-up node control unit further includes: a first storage capacitor, a first end of which is connected to the pull-up node, and a second end of which is connected to the gate driving signal output end; and/or a second storage capacitor, a first end of which is connected to the pull-up node, and a second end of which is connected to the carry signal output end.

In a possible embodiment of the present disclosure, the first clock signal is at the second level within a time period at a very beginning of the pull-down maintenance stage, then the first clock signal is to be at the second level each time after a predetermined interval, and at the first level within the predetermined interval.

In a possible embodiment of the present disclosure, the shift register unit further includes a second clock signal input end. The gate driving signal output unit is further configured to receive the first level, connected to the second clock signal input end, and configured to enable the gate driving signal output end to output a second clock signal at the input stage, the output stage and a pull-down stage under the control of the pull-up node, and enable the gate driving signal output end to output the first level at the pull-down maintenance stage under the control of the pull-down node. The carry signal output unit is further configured to receive the first level, connected to the second clock signal input end, and configured to enable the carry signal output end to output the second clock signal at the input stage, the output stage and the pull-down stage under the control of the pull-up node, and enable the carry signal output end to output the first level at the pull-down maintenance stage under the control of the pull-down node. At the input stage and the pull-down stage, the second clock signal is at the first level, and at the output stage, the second clock signal is at the second level.

In a possible embodiment of the present disclosure, a duty ratio of the first clock signal and a duty ratio of the second clock signal are each 0.25. A duration of the input stage, a duration of the output stage and a duration of the pull-down stage are each one time unit. The first clock signal is delayed by two time units as compared with the second clock signal.

In a possible embodiment of the present disclosure, the predetermined interval is three time units.

In a possible embodiment of the present disclosure, the first level is a low level and the second level is a high level, or the first level is a high level and the second level is a low level.

In a possible embodiment of the present disclosure, the second pull-up node control unit is further connected to the pull-down node, and configured to enable the pull-up node to be at the first level in the case that the pull-down node is at the second level.

In a possible embodiment of the present disclosure, the second pull-up node control unit includes: a third transistor, a gate electrode of which is connected to the first clock signal input end, a first electrode of which is connected to the pull-up node, and a second electrode of which is configured to receive the first level; and a fourth transistor, a gate electrode of which is connected to the pull-down node, a first electrode of which is connected to the pull-up node, and a second electrode of which is configured to receive the first level.

In a possible embodiment of the present disclosure, the first pull-down node control unit includes a fifth transistor, a gate electrode and a first electrode of which is connected to the first clock signal input end, and a second electrode of which is connected to the pull-down node.

In a possible embodiment of the present disclosure, the second pull-down node control unit is further connected to the carry signal output end of the adjacent next-level shift register unit, and further configured to enable the pull-down node to be at the first level in the case that the carry signal output end of the adjacent next-level shift register unit outputs the second level.

In a possible embodiment of the present disclosure, the second pull-down node control unit includes: a sixth transistor, a gate electrode of which is connected to the carry signal output end of the adjacent next-level shift register unit, a first electrode of which is connected to the pull-down node, and a second electrode of which is configured to receive the first level; and a seventh transistor, a gate electrode of which is connected to the pull-up node, a first electrode of which is connected to the pull-down node, and a second electrode is configured to receive the first level.

In a possible embodiment of the present disclosure, the gate driving signal output unit includes: a first gate driving signal outputting transistor, a gate electrode of which is connected to the pull-up node, a first electrode of which is connected to the second clock signal input end, and a second electrode of which is connected to the gate driving signal output end; and a second gate driving signal outputting transistor, a gate electrode of which is connected to the pull-down node, a first electrode of which is connected to the gate driving signal output end, and a second electrode of which is configured to receive the first level. The carry signal output unit includes: a first carry signal outputting transistor, a gate electrode of which is connected to the pull-up node, a first electrode of which is connected to the second clock signal input end, and a second electrode of which is connected to the carry signal output end; and a second carry signal outputting transistor, a gate electrode of which is connected to the pull-down node, a first electrode of which is connected to the carry signal output end, and a second electrode of which is configured to receive the first level.

In another aspect, the present disclosure, the present disclosure provides in some embodiments a method for driving a shift register unit, including steps of: at an input stage, enabling, by a second pull-down node control unit, a pull-down node to be at a first level under the control of a pull-up node, and enabling, by a first pull-up node control unit, the pull-up node to be at a second level; at an output stage, enabling, by the first pull-up node control unit, the pull-up node to be maintained at the second level, and enabling, by the second pull-down node control unit, the pull-down node to be at the first level under the control of the pull-up node; at a pull-down stage, enabling the pull-up node to be maintained at the second level, and enabling, by the second pull-down node control unit, the pull-down node to be at the first level under the control of the pull-up node; and at a pull-down maintenance stage, enabling, by the second pull-up node control unit, the pull-up node to be at the first level under the control of the first clock signal, and enabling, by the first pull-down node control unit, the pull-down node to be at the second level under the control of the first clock signal.

In a possible embodiment of the present disclosure, the step of at the input stage, enabling, by the first pull-up node control unit, the pull-up node to be at the second level includes: during forward scanning, enabling, by the first pull-up node control unit, the first pull-up node to be at the second level under the control of a first carry signal, the first carry signal being a carry signal outputted from an adjacent previous-level shift register unit; and during backward scanning, enabling, by the first pull-up node control unit, the pull-up node to be at the second level under the control of a second carry signal, the second carry signal being a carry signal outputted from an adjacent next-level shift register unit.

In a possible embodiment of the present disclosure, the method further includes enabling, by a gate driving signal output unit, a gate driving signal output end to output a gate driving signal and enabling, by a carry signal output unit, a carry signal output end to output a carry signal under the control of the pull-up node and the pull-down node.

In a possible embodiment of the present disclosure, the step of enabling, by the gate driving signal output unit, the gate driving signal output end to output the gate driving signal and enabling, by the carry signal output unit, the carry signal output end to output the carry signal under the control of the pull-up node and the pull-down node includes: at the input stage, the output stage and the pull-down stage, enabling, by the gate driving signal output unit, the gate driving signal output end to output a second clock signal under the control of the pull-up node, and enabling, by the carry signal output unit, the carry signal output end to output the second clock signal under the control of the pull-up node; and at the pull-down maintenance stage, enabling, by the gate driving signal output unit, the gate driving signal output end to output the first level under the control of the pull-down node, and enabling, by the carry signal output unit, the carry signal output end to output the first level under the control of the pull-down node. At the input stage and the pull-down stage, the second clock signal is at the first level, and at the output stage, the second clock signal is at the second level.

In a possible embodiment of the present disclosure, a duty ratio of the first clock signal and a duty ratio of the second clock signal are each 0.25. A duration of the input stage, a duration of the output stage and a duration of the pull-down stage are each one time unit. The first clock signal is delayed by two time units as compared with the second clock signal.

In yet another aspect, the present disclosure provides in some embodiments a gate driver circuit including multiple levels of the above-mentioned shift register units. The shift register units at odd-numbered levels are arranged at a left side of a display panel and the shift register units at even-numbered levels are arranged at a right side of the display panel, or the shift register units at even-numbered levels are arranged at the left side of the display panel and the shift register units at odd-numbered levels are arranged at the right side of the display panel.

In still yet another aspect, the present disclosure provides in some embodiments a gate driver circuit, including multiple levels of shift register units. A second clock signal input end of an $(8n-7)^{th}$-level shift register unit is configured to receive a first left-side clock signal or a first right-side clock signal; a second clock signal input end of an $(8n-5)^{th}$-level shift register unit is configured to receive a second left-side clock signal or a second right-side clock signal; a first clock signal input end of the $(8n-7)^{th}$-level shift register unit is configured to a third left-side clock signal or a third right-side clock signal; a first clock signal input end of the $(8n-5)^{th}$ shift register unit is configured to receive a fourth left-side clock signal or a fourth right-side clock signal; a second clock signal input end of an $(8n-6)^{th}$-level shift register unit is configured to receive the first right-side clock signal or the first left-side clock signal; a second clock signal input end of an $(8n-4)^{th}$-level shift register unit is configured to receive the second right-side clock signal or the second left-side clock signal; a first clock signal input end of the $(8n-6)^{th}$-level shift register unit is configured to the third right-side clock signal or the third left-side clock signal; a first clock signal input end of the $(8n-4)^{th}$-level shift register unit is configured to receive the fourth right-side clock signal or the fourth left-side clock signal; a second clock signal input end of an $(8n-3)^{th}$-level shift register unit is configured to receive the third left-side clock signal or the third right-side clock signal; a second clock signal input end of an $(8n-1)^{th}$-level shift register unit is configured to receive the fourth left-side clock signal or the fourth right-side clock signal; a first clock signal input end of the $(8n-3)^{th}$-level shift register unit is configured to receive the first left-side clock signal or the first right-side clock signal; a first clock signal input end of the $(8n-1)^{th}$-level shift register unit is configured to receive the second left-side clock signal or the second right-side clock signal; a second clock signal input end of an $(8n-2)^{th}$-level shift register unit is configured to receive the third right-side clock signal or the third left-side clock signal; a second clock signal input end of an $(8n)^{th}$-level shift register unit is configured to receive the fourth right-side clock signal or the fourth left-side clock signal; a first clock signal input end of the $(8n-2)^{th}$-level shift register unit is configured to receive the first right-side clock signal or the first left-side clock signal; and a first clock signal input end of the $(8n)^{th}$-level shift register unit is configured to receive the second right-side clock signal or the second left-side clock signal, where n is a positive integer. The second left-side clock signal is delayed by one time unit as compared with the first left-side clock signal, the third left-side clock signal is delayed by one time unit as compared with the second left-side clock signal, and the fourth left-side clock signal is delayed by one time unit as compared with the third left-side clock signal. The second right-side clock signal is delayed by one time unit as compared with the first right-side clock signal, the third right-side clock signal is delayed by one time unit as compared with the second right-side clock signal, and the fourth right-side clock signal is delayed by one time unit as compared with the third right-side clock signal. The first right-side clock signal is delayed by 0.5 time unit as compared with the first left-side clock signal. Each clock signal has a duty ratio of 0.25, and each clock signal is maintained at the first level for three time units and at the second level for one time unit. Apart from a first-level shift register unit on the left, a first carry signal input end of a current-level shift register unit on the left is connected to a carry signal output end of an adjacent previous-level shift register unit on the left. Apart from a first-level shift register unit on the right, a first carry signal input end of a current-level shift register unit on the right is connected to a carry signal output end of an adjacent previous-level shift register unit on the right. Apart from a last-level shift register unit on the left, a second carry signal input end of a current-level shift register unit on the left is connected to a carry signal output end of an adjacent next-level shift register unit on the left. Apart from a last-level shift register unit on the right, a second carry signal input end of a current-level shift register unit on the right is connected to a carry signal output end of an adjacent next-level shift register unit on the right.

In still yet another aspect, the present disclosure provides in some embodiments a display device including a display panel and the above-mentioned gate driver circuit.

According to the shift register unit, the driving method thereof, the gate driver circuit and the display device in the embodiments of the present disclosure, the first pull-up node control unit, the second pull-up node control unit, the first pull-down node control unit and the second pull-down node control unit may all be driven by alternate current (AC), so it is able to prevent the occurrence of leakage current for a polycrystalline TFT, thereby to prevent the occurrence of a relatively large drift for the threshold voltage of the TFT in the case that it operates for a long time period or at a high temperature. In addition, the carry signal and the gate driving signal are outputted separately, so it is able to increase a response speed of an amorphous silicon TFT.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
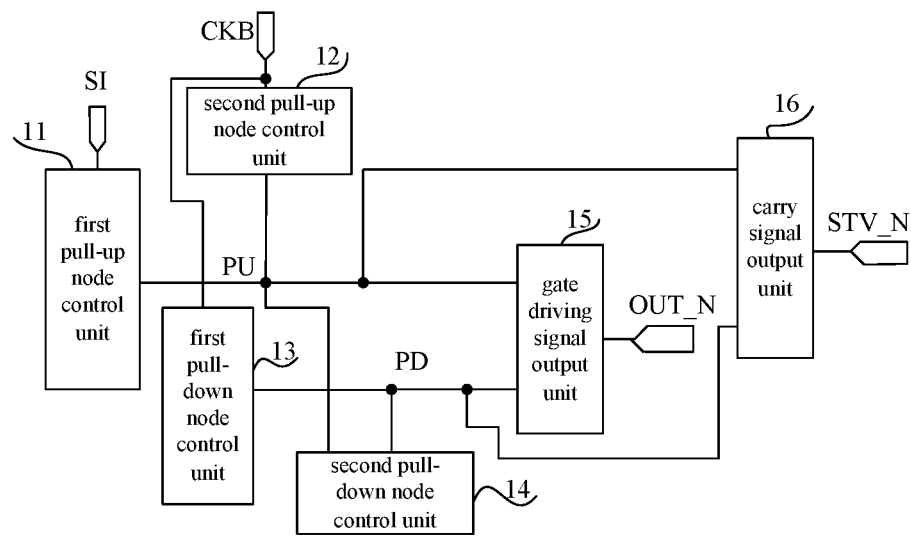
FIG. 1 is a schematic view showing a shift register unit according to one embodiment of the present disclosure.

As shown in FIG. 1, the present disclosure provides in some embodiments a shift register unit, which includes a gate driving signal output end OUT_N, a carry signal output end STV_N, a first clock signal input end for inputting a first clock signal CKB, and a carry signal input end S1.

The shift register unit further includes: a first pull-up node control unit 11 connected to a pull-up node PU and the carry signal input end; a second pull-up node control unit 12 connected to the pull-up node PU and the first clock signal input end, and configured to enable the pull-up node PU to be at a first level at a pull-down maintenance stage under the control of the first clock signal CKB; a first pull-down node control unit 13 connected to a pull-down node PD and the first clock signal input end, and configured to enable the pull-down node PD to be at a second level at the pull-down maintenance stage under the control of the first clock signal CKB; a second pull-down node control unit 14 connected to the pull-up node PU and the pull-down node PD, and configured to enable the pull-down node PD to be at the first level in the case that the pull-up node PU is at the second level; a gate driving signal output unit 15 connected to the pull-up node PU, the pull-down node PD and the gate driving signal output end OUT_N, and configured to enable the gate driving signal output end OUT_N to output a gate driving signal under the control of the pull-up node PU and the pull-down node PD; and a carry signal output unit 16 connected to the pull-up node PU, the pull-down node PD and the carry signal output end STV_N, and configured to enable the carry signal output end STV_N to output a carry signal under the control of the pull-up node PU and the pull-down node PD.

During the actual operation, a pull-down stage is also provided between an output stage and the pull-down maintenance stage, and at the pull-down stage, the pull-up node is maintained at the second level. The operations of the shift register unit at an input stage, the output stage, the pull-down stage and the pull-down maintenance stage will be described hereinafter in more details.

Figure 2:
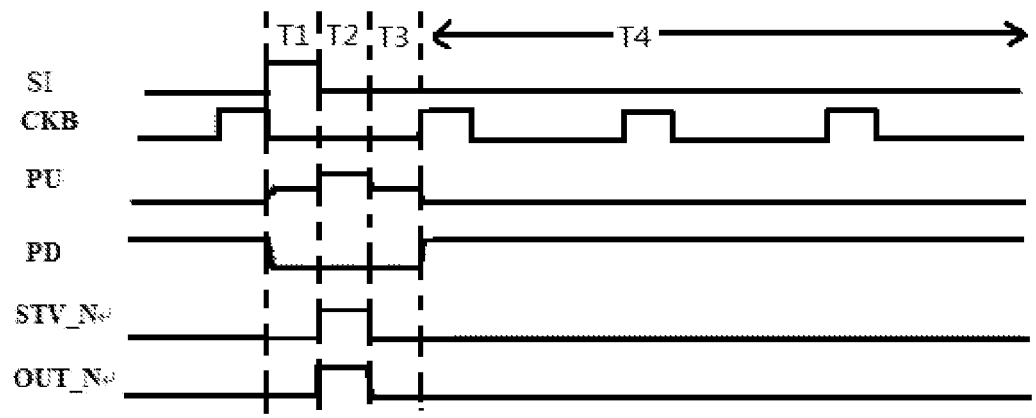
FIG. 2 is a time sequence diagram of the shift register unit in FIG. 1.

To be specific, the first level may be a low level and the second level may be a high level, or the first level may be a high level and the second level may be a low level. In FIG. 2, the first level is a low level and the second level is a high level, but an operation sequence of the shift register unit is not limited to that shown in FIG. 2.

As shown in FIG. 2, which is a time sequence diagram of the shift register unit in FIG. 1, T1 represents the input stage, T2 represents the output stage, T3 represents the pull-down stage, and T4 represents the pull-down maintenance stage.

According to the shift register unit in the embodiments of the present disclosure, the first pull-up node control unit, the second pull-up node control unit, the first pull-down node control unit and the second pull-down node control unit may all be driven by AC, so it is able to suppress leakage current of a polycrystalline TFT, thereby to prevent the occurrence of a relatively large drift for the threshold voltage of the TFT in the case that it operates for a long time period or at a high temperature. In addition, the carry signal and the gate driving signal are outputted separately, so it is able to increase a response speed of an amorphous silicon TFT.

During the actual operation, the first pull-up node control unit is configured to enable the pull-up node to be at the second level at the input stage under the control of the carry signal, and maintain the pull-up node at the second level at the output stage.

To be specific, the carry signal input end includes a first carry signal input end for inputting a first carry signal and a second carry signal input end for inputting a second carry signal. During forward scanning, the first carry signal input end is connected to a carry signal output end of an adjacent previous-level shift register unit, and the first carry signal is a carry signal from the adjacent previous-level shift register unit. During forward scanning, the first pull-up node control unit is further configured to enable the pull-up node to be at the second level at the input stage under the control of the first carry signal. During backward scanning, the second carry signal input end is connected to a carry signal output end of an adjacent next-level shift register unit, and the second carry signal is a carry signal from the adjacent next-level shift register unit. During backward scanning, the first pull-up node control unit is further configured to enable the pull-up node to be at the second level at the input stage under the control of the second carry signal.

Figure 3A:
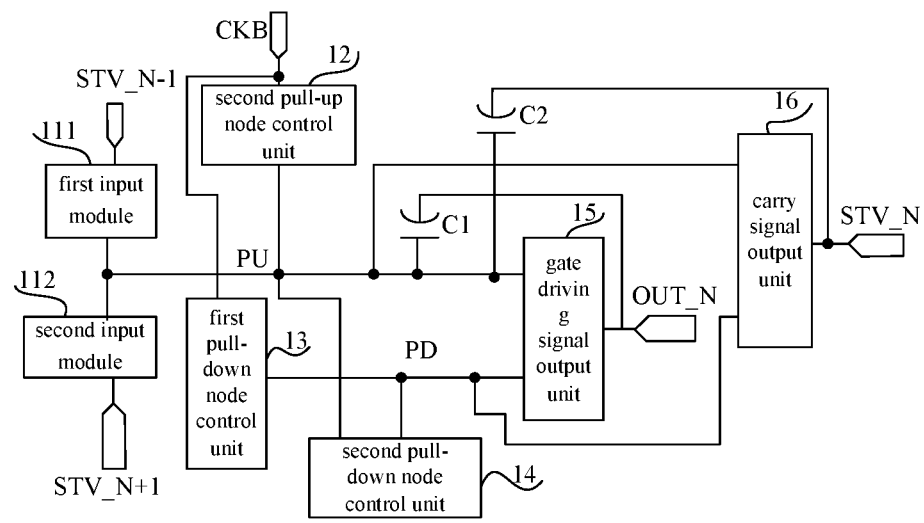
FIG. 3A is another schematic view showing the shift register unit according to one embodiment of the present disclosure.
Figure 3B:
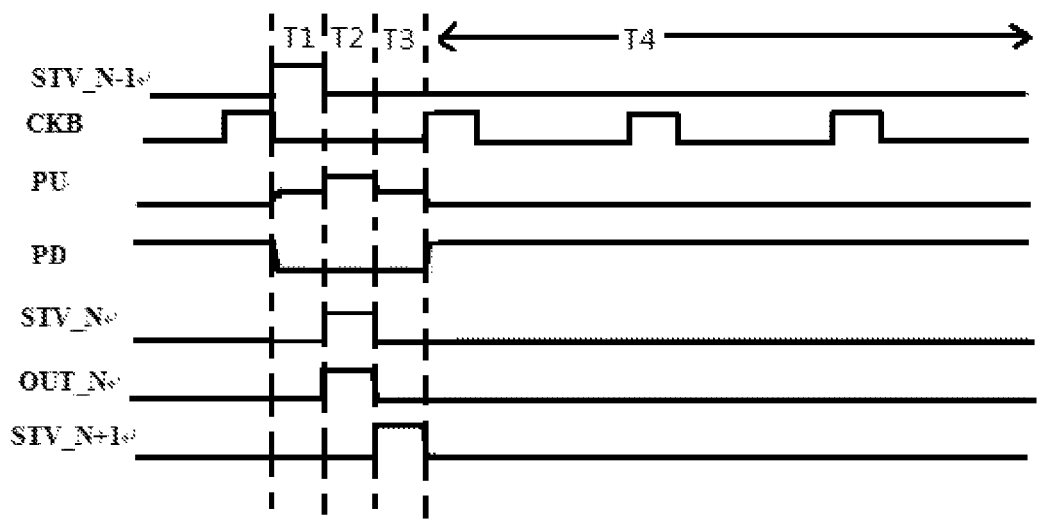
FIG. 3B is a time sequence diagram of the shift register unit according to one embodiment of the present disclosure.

To be specific, the carry signal input end may include a first carry signal input end and a second carry signal input end. As shown in FIG. 3A, the first carry signal input end is configured to input a carry signal outputted from a carry signal output end STV_N−1 of an adjacent previous-level shift register unit, and the second carry signal input end is configured to input a carry signal outputted from a carry signal output end STV_N+1 of an adjacent next-level shift register unit. The first pull-up node control unit includes: a first input module 111 connected to the pull-up node PU and connected to the carry signal output end STV_N−1 of the adjacent previous-level shift register unit via the first carry signal input end, and configured to, during the forward scanning, enable the pull-up node PU to be at the second level at the input stage under the control of a first carry signal; and a second input module 112 connected to the pull-up node PU, and connected to the carry signal output end STV_N+1 of the adjacent next-level shift register unit via the second carry signal input end, and configured to, during the backward scanning, enable the pull-up node PU to be at the second level at the input stage under the control of a second carry signal. The first carry signal is just a carry signal outputted from the carry signal output end STV_N−1 of the adjacent previous-level shift register unit, and during the forward scanning, the carry signal outputted from STV_N−1 at the input stage is at the second level. The second carry signal is just a carry signal outputted from the carry signal output end STV_N+1 of the adjacent next-level shift register unit, and during the backward scanning, the carry signal outputted from STV_N+1 at the input stage is just the second level. FIG. 3B shows the first carry signal outputted from STV_N−1 and the second carry signal outputted from STV_N+1.

To be specific, the first input module may include a first transistor, a gate electrode and a first electrode of which are connected to the carry signal output end of the adjacent previous-level shift register unit via the first carry signal input end, and a second electrode of which is connected to the pull-up node. The second input module may include a second transistor, a gate electrode and a second electrode of which are connected to the carry signal output end of the adjacent next-level shift register unit via the second carry signal input end, and a first electrode of which is connected to the pull-up node.

During the actual operation, the first pull-up node control unit may further include: a first storage capacitor, a first end of which is connected to the pull-up node, and a second end of which is connected to the gate driving signal output end OUT_N; and/or a second storage capacitor, a first end of which is connected to the pull-up node, and a second end of which is connected to the carry signal output end STV_N. The first storage capacitor and/or the second storage capacitor are configured to pull up a potential at the pull-up node PU at the output stage in a bootstrapping manner.

Optionally, as shown in FIG. 3, the first pull-up node control unit may further include: a first storage capacitor C1, a first end of which is connected to the pull-up node PU, and a second end of which is connected to the gate driving signal output end OUT_N; and a second storage capacitor C2, a first end of which is connected to the pull-up node PU, and a second end of which is connected to the carry signal output end STV_N. The first storage capacitor C1 and the second storage capacitor C2 are configured to pull up a potential at the pull-up node PU at the output stage in a bootstrapping manner.

To be specific, the first clock signal is at the second level within a time period at the very beginning of the pull-down maintenance stage, then the first clock signal is to be at the second level every time a predetermined time interval is passed, and at the first level within the predetermined time interval.

To be specific, as shown in FIG. 2, a waveform of the first clock signal CKB will be described as follows.

At the very beginning of the pull-down maintenance stage T4, the first clock signal CKB may be at a high level, so as to enable the pull-down node PD to recieve a low level under the control of the second pull-up node control unit, thereby to pull down the potential at the pull-down node PD. Then, the first clock signal CKB may be at a high level every time after a predetermined interval and at a low level within the predetermined interval, so as to drive the second pull-up node control unit by AC.

Figure 4:
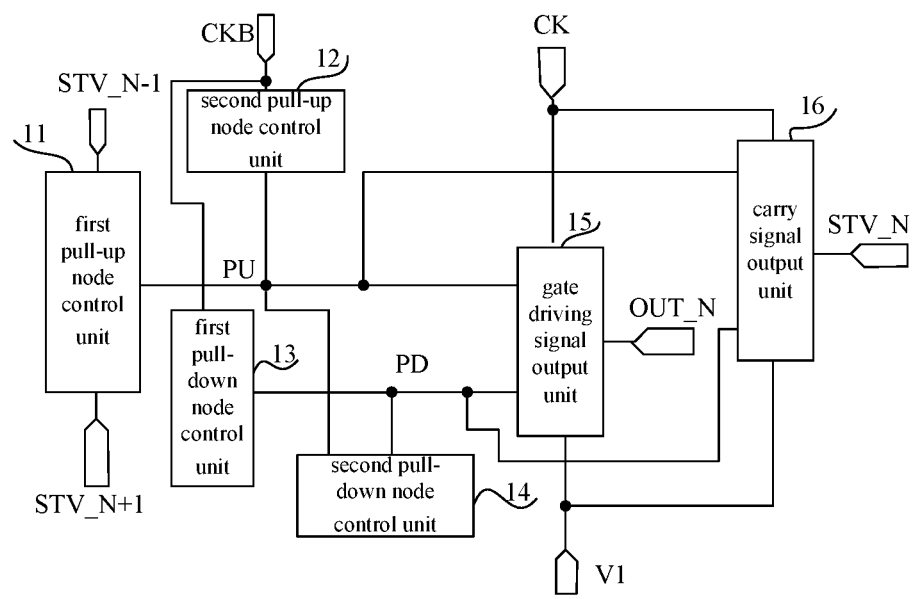
FIG. 4 is yet another schematic view showing the shift register unit according to one embodiment of the present disclosure.
Figure 5:
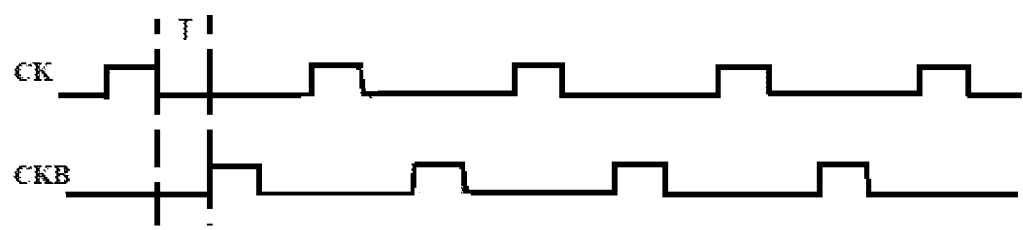
FIG. 5 is a waveform diagram of a first clock signal CKB and a second clock signal CK.

To be specific, as shown in FIG. 4, the shift register unit may further include a second clock signal input end for inputting a second clock signal CK. The gate driving signal output unit 15 is further configured to receive a first level V1, connected to the second clock signal input end, and configured to enable the gate driving signal output end OUT_N to output the second clock signal CK at the input stage, the output stage and a pull-down stage under the control of the pull-up node PU, and enable the gate driving signal output end OUT_N to output the first level V1 at the pull-down maintenance stage under the control of the pull-down node PD. The carry signal output unit 16 is further configured to receive the first level V1, connected to the second clock signal input end, and configured to enable the carry signal output end STV_N to output the second clock signal CK at the input stage, the output stage and the pull-down stage under the control of the pull-up node PU, and enable the carry signal output end STV_N to output the first level V1 at the pull-down maintenance stage under the control of the pull-down node PD. At the input stage and the pull-down stage, the second clock signal CK is at the first level, and at the output stage, the second clock signal CK is at the second level. As shown in FIG. 5, a duty ratio of the first clock signal CKB and a duty ratio of the second clock signal CK are each 0.25. A duration of the input stage, a duration of the output stage and a duration of the pull-down stage are each one time unit. The first clock signal CKB is delayed by two time units as compared with the second clock signal CK. In FIG. 5, T represents one time unit, and the above-mentioned predetermined interval includes three time units.

In FIG. 5, the first level is a low level and the second level is a high level. However, during the actual operation, the first level may be a high level and the second level may be a low level.

Figure 6:
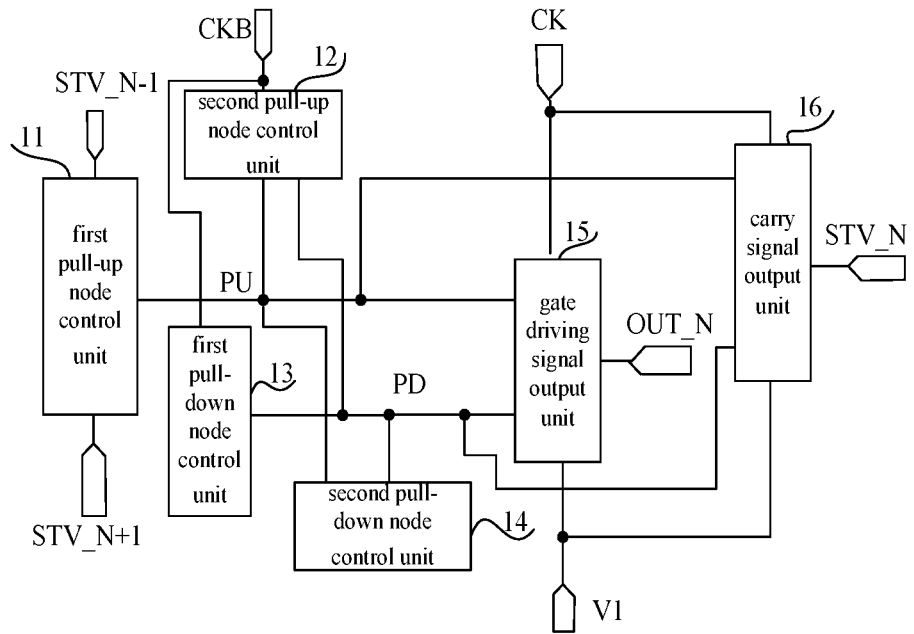
FIG. 6 is still yet another schematic view showing the shift register unit according to one embodiment of the present disclosure.

During the actual operation, as shown in FIG. 6, the second pull-up node control unit 12 may be further connected to the pull-down node PD and configured to enable the pull-up node PU to be at the first level in the case that the pull-down node PD is at the second level.

To be specific, the second pull-up node control unit includes: a third transistor, a gate electrode of which is connected to the first clock signal input end, a first electrode of which is connected to the pull-up node, and a second electrode of which is configured to receive the first level; and a fourth transistor, a gate electrode of which is connected to the pull-down node, a first electrode of which is connected to the pull-up node, and a second electrode of which is configured to receive the first level.

To be specific, the first pull-down node control unit includes a fifth transistor, a gate electrode and a first electrode of which is connected to the first clock signal input end, and a second electrode of which is connected to the pull-down node.

Figure 7:
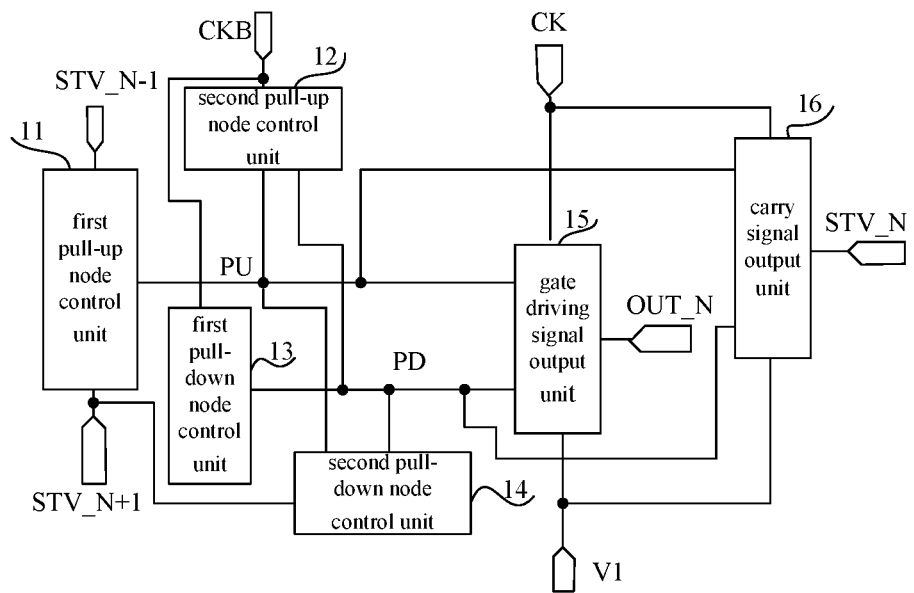
FIG. 7 is still yet another schematic view showing the shift register unit according to one embodiment of the present disclosure.

To be specific, as shown in FIG. 7, the second pull-down node control unit 14 is further connected to the carry signal output end STV_N+1 of the adjacent next-level shift register unit, and further configured to enable the pull-down node PD to be at the first level in the case that the carry signal output end STV_N+1 of the adjacent next-level shift register unit outputs the second level.

To be specific, the second pull-down node control unit includes: a sixth transistor, a gate electrode of which is connected to the carry signal output end of the adjacent next-level shift register unit, a first electrode of which is connected to the pull-down node, and a second electrode of which is configured to receive the first level; and a seventh transistor, a gate electrode of which is connected to the pull-up node, a first electrode of which is connected to the pull-down node, and a second electrode is configured to receive the first level.

To be specific, the gate driving signal output unit includes: a first gate driving signal outputting transistor, a gate electrode of which is connected to the pull-up node, a first electrode of which is connected to the second clock signal input end, and a second electrode of which is connected to the gate driving signal output end; and a second gate driving signal outputting transistor, a gate electrode of which is connected to the pull-down node, a first electrode of which is connected to the gate driving signal output end, and a second electrode of which is configured to receive the first level. The carry signal output unit includes: a first carry signal outputting transistor, a gate electrode of which is connected to the pull-up node, a first electrode of which is connected to the second clock signal input end, and a second electrode of which is connected to the carry signal output end; and a second carry signal outputting transistor, a gate electrode of which is connected to the pull-down node, a first electrode of which is connected to the carry signal output end, and a second electrode of which is configured to receive the first level.

During the actual operation, for the shift register unit in the embodiments of the present disclosure, in the case that the transistors of the gate driving signal output unit and the transistors of the carry signal output unit are all n-type transistors, the first level may be a low level and the second level may be a high level. In the case that the transistors of the gate driving signal output unit and the transistors of the carry signal output unit are all p-type transistors, the first level may be a high level and the second level may be a low level.

All the transistors adopted in the embodiments of the present disclosure may be TFTs, field-effect transistors (FETs) or any other elements having an identical characteristic. Two electrodes of each transistor other than a gate electrode may be called as a first electrode and a second electrode, which may be replaced with each other depending on a flow direction of the current. In other words, the first electrode may be a source electrode and the second electrode may be a drain electrode, or the first electrode may be a drain electrode and the second electrode may be a source electrode. Of course, in the embodiments of the present disclosure, p-type transistors may also be adopted.

The shift register unit will be further described hereinafter.

Figure 8:
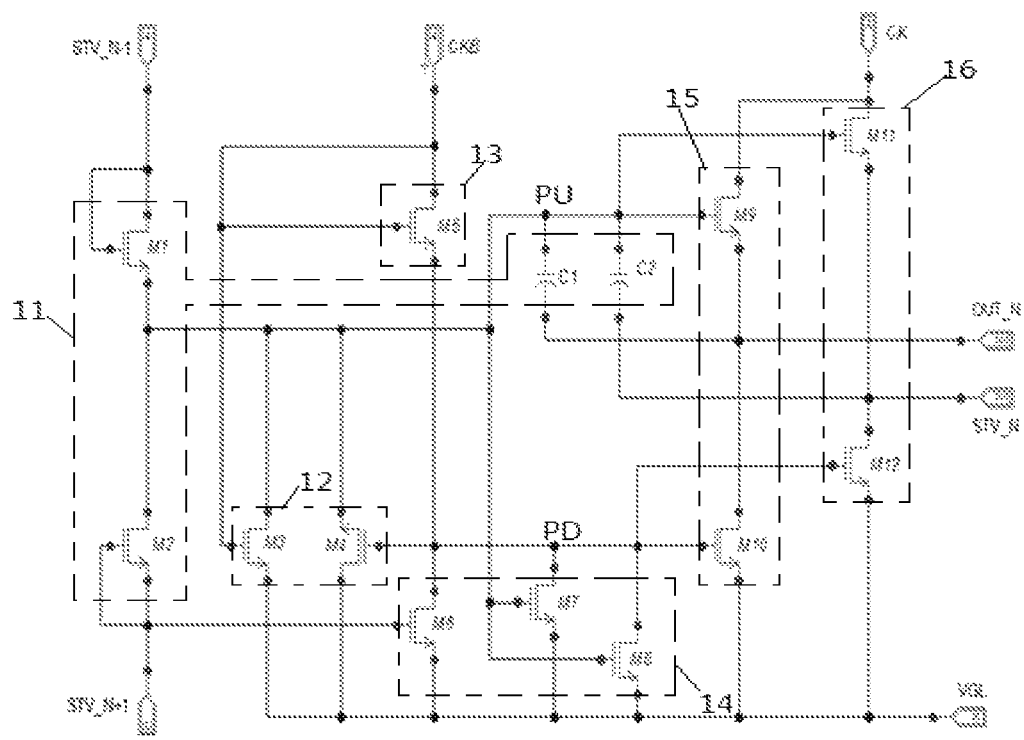
FIG. 8 is a circuit diagram of the shift register unit according to one embodiment of the present disclosure.

As shown in FIG. 8, the shift register unit includes a gate driving signal output end OUT_N, a carry signal output end STV_N, a first clock signal input end for inputting a first clock signal CKB, a first carry signal input end and a second carry signal input end. The first carry signal input end is configured to input a carry signal outputted from a carry signal output end STV_N−1 of an adjacent previous-level shift register unit. The second carry signal input end is configured to input a carry signal outputted from a carry signal output end STV_N+1 of an adjacent next-level shift register unit.

The shift register unit further includes a first pull-up node control unit 11, a second pull-up node control unit 12, a first pull-down node control unit 13, a second pull-down node control unit 14, a gate driving signal output unit 15 and a carry signal output unit 16.

The first pull-up node control unit 11 includes: a first transistor M1, a gate electrode and a drain electrode of which are connected to the carry signal output end STV_N−1 of the adjacent previous-level shift register unit via the first carry signal input end, and a source electrode of which is connected to the pull-up node PU; a second transistor M2, a gate electrode and a source electrode of which are connected to the carry signal output end STV_N+1 of the adjacent next-level shift register unit via the second carry signal input end, and a drain electrode of which is connected to the pull-up node PU; a first storage capacitor C1, a first end of which is connected to the pull-up node PU, and a second end of which is connected to the gate driving signal output end OUT_N; and a second storage capacitor C2, a first end of which is connected to the pull-up node PU, and a second end of which is connected to the carry signal output end STV_N.

The second pull-up node control unit 12 includes: a third transistor M3, a gate electrode of which is connected to the first clock signal input end for inputting the first clock signal CKB, a drain electrode of which is connected to the pull-up node PU, and a source electrode of which is configured to receive a low level VGL; and a fourth transistor M4, a gate electrode of which is connected to the pull-down node PD, a drain electrode of which is connected to the pull-up node PU, and a source electrode of which is configured to receive the low level VGL.

The first pull-down node control unit 13 includes a fifth transistor M5, a gate electrode and a drain electrode of which are connected to the first clock signal input end, and a source electrode of which is connected to the pull-down node PD.

The second pull-down node control unit 14 includes: a sixth transistor M6, a gate electrode of which is connected to the carry signal output end STV_N+1 of the adjacent next-level shift register unit, a drain electrode of which is connected to the pull-down node PD, and a source electrode of which is configured to receive the low level VGL; a seventh transistor M7, a gate electrode of which is connected to the pull-up node PU, a drain electrode of which is connected to the pull-down node PD, and a source electrode of which is configured to receive the low level VGL; and an eighth transistor M8, a gate electrode of which is connected to the pull-up node PU, a drain electrode of which is connected to the pull-down node PD, and a source electrode of which is configured to receive the low level VGL.

The gate driving signal output unit 15 includes: a first gate driving signal outputting transistor M9, a gate electrode of which is connected to the pull-up node, a drain electrode of which is connected to the second clock signal input end for inputting the second clock signal CK, and a source electrode of which is connected to the gate driving signal output end OUT_N; and a second gate driving signal outputting transistor M10, a gate electrode of which is connected to the pull-down node, a drain electrode of which is connected to the gate driving signal output end OUT_N, and a source electrode of which is configured to receive the low level VGL.

The carry signal output unit 16 includes: a first carry signal outputting transistor M11, a gate electrode of which is connected to the pull-up node PU, a drain electrode of which is connected to the second clock signal input end, and a source electrode of which is connected to the carry signal output end STV_N; and a second carry signal outputting transistor M12, a gate electrode of which is connected to the pull-down node PD, a drain electrode of which is connected to the carry signal output end STV_N, and a source electrode of which is configured to receive the low level VGL.

In FIG. 8, all the transistors are n-type transistors, the first level is a low level, and the second level is a high level. In addition, M7 and M8 are used to pull down the potential at the pull-down node PD at a larger speed.

Figure 9:
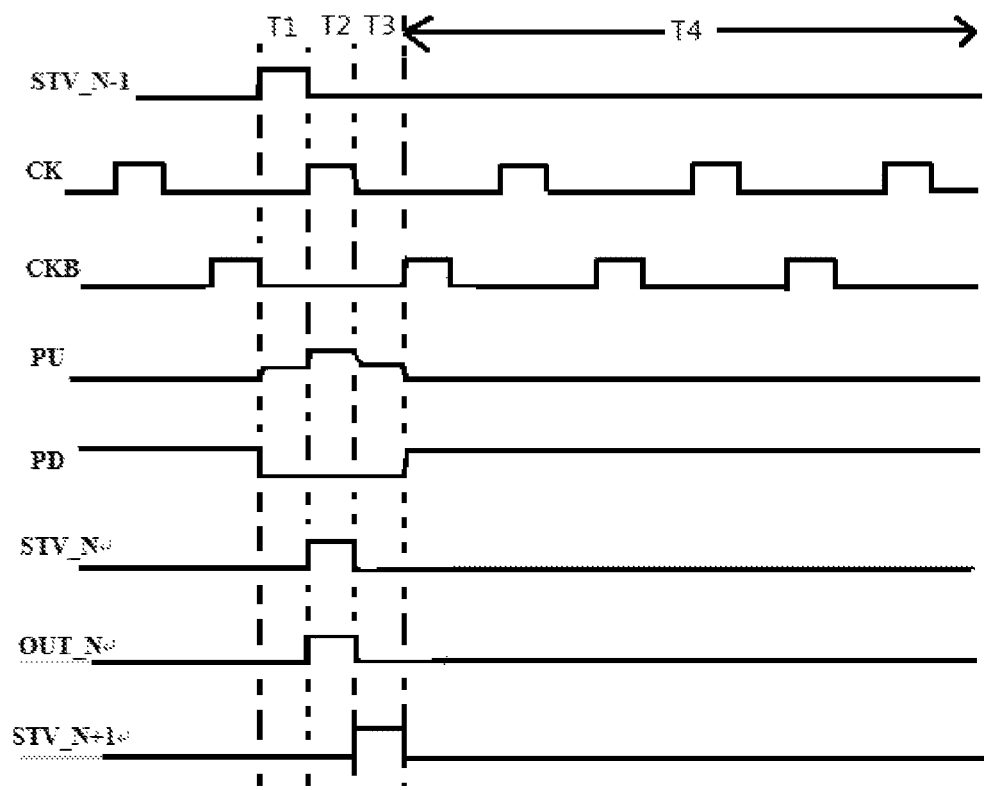
FIG. 9 is a time sequence diagram of the shift register unit in FIG. 8.

As shown in FIG. 9, during the operation of the shift register unit in FIG. 8, within each display period, at the input stage T1, STV_N−1 outputs a high level and CK is at a low level, so M1 is turned on to pull up the potential at PU. M9 and M11 are both turned on so as to enable OUT_N and STV_N to output a low level. M7 and M8 are both turned on, so as to pull down the potential at PD.

At the output stage T2, STV_N−1 outputs a low level and CK is at a high level, so M1 is turned off. Due to a bootstrapping effect of C1 and C2, the potential at PU is pulled up continuously, M9 and M11 are still in an on state, and at this time, OUT_N and STV_N output a high level. M7 and M8 are turned on, so the potential at PD is continuously pulled down.

At the pull-down stage T3, CK is at a low level, and OUT_N and STV_N output a low level. At this time, the bootstrapping effect of C1 and C2 does not exist, so the potential at PU, although being maintained at a high level, is reduced to an initial pull-up state.

At the pull-down maintenance stage T4, within a first time unit of T4, CK is at a low level and CKB is at a high level, so M3, M4 and M5 are all turned on, so as to pull up the potential at PD and pull down the potential at PU. M10 and M12 are turned on, so OUT_N and STV_N output a low level. After the elapse of three time units, CKB is at a high level again, so as to pull up the potential at PD again, thereby to enable M10 and M12 in the on state and maintain the potential at PU in a pull-down state. In addition, OUT_N and STV_N output a low level, so it is able to effectively prevent the introduction of a noise in an out-of-service state.

As can be seen from the above-mentioned operation procedure of the shift register unit in FIG. 8, the first pull-up node control unit 11, the second pull-up node control unit 12, the first pull-down node control unit 13 and the second pull-down node control unit 14 may be driven by AC, so it is able to suppress leakage current of a polycrystalline TFT, and prevent the occurrence of a relatively large drift for the threshold voltage of the TFT in the case that the TFT operates for a long time period or at a high temperature, thereby to ensure the TFT to be maintained at a low level or a high level. In addition, the carry signal and the gate driving signal are outputted separately, so it is able to increase a response speed of an amorphous silicon TFT.

During the actual operation, a first storage capacitor C1 or a second storage capacitor C2 may not be adopted by the shift register unit, and instead, the potential at PU may be pulled up due to a bootstrapping effect of a coupling capacitor Cgs of M9 and a coupling capacitor of M11.

The present disclosure further provides in some embodiments a method for driving the above-mentioned shift register unit, which includes steps of: at the input stage, enabling, by the second pull-down node control unit, the pull-down node to be at a first level under the control of the pull-down node, and enabling, by the first pull-up node control unit, the pull-up node to be at a second level; at the output stage, enabling, by the first pull-up node control unit, the pull-up node to be maintained at the second level, and enabling, by the second pull-down node control unit, the pull-down node to be at the first level under the control of the pull-up node; at a pull-down stage, enabling the pull-up node to be maintained at the second level, and enabling, by the second pull-down node control unit, the pull-down node to be at the first level under the control of the pull-up node; and at the pull-down maintenance stage, enabling, by the second pull-up node control unit, the pull-up node to be at the first level under the control of the first clock signal, and enabling, by the first pull-down node control unit, the pull-down node to be at the second level under the control of the first clock signal.

According to the method for driving the shift register unit in the embodiments of the present disclosure, the first pull-up node control unit, the second pull-up node control unit, the first pull-down node control unit and the second pull-down node control unit may be driven by AC, so it is able to suppress leakage current of a polycrystalline TFT, and prevent the occurrence of a relatively large drift for the threshold voltage of the TFT in the case that it operates for a long time period or at a high temperature.

To be specific, the step of at the input stage, enabling, by the first pull-up node control unit, the pull-up node to be at the second level includes: during forward scanning, enabling, by the first pull-up node control unit, the first pull-up node to be at the second level under the control of a first carry signal, the first carry signal being a carry signal outputted from an adjacent previous-level shift register unit; and during backward scanning, enabling, by the first pull-up node control unit, the pull-up node to be at the second level under the control of a second carry signal, the second carry signal being a carry signal outputted from an adjacent next-level shift register unit.

To be specific, the method further includes enabling, by a gate driving signal output unit, the gate driving signal output end to output a gate driving signal and enabling, by the carry signal output unit, a carry signal output end to output a carry signal under the control of the pull-up node and the pull-down node.

According to the embodiments of the present disclosure, the carry signal and the gate driving signal are outputted separately, so it is able to increase a response speed of an amorphous silicon TFT.

More specifically, the step of enabling, by the gate driving signal output unit, the gate driving signal output end to output the gate driving signal and enabling, by the carry signal output unit, the carry signal output end to output the carry signal under the control of the pull-up node and the pull-down node includes: at the input stage, the output stage and the pull-down stage, enabling, by the gate driving signal output unit, the gate driving signal output end to output a second clock signal under the control of the pull-up node, and enabling, by the carry signal output unit, the carry signal output end to output the second clock signal under the control of the pull-up node; and at the pull-down maintenance stage, enabling, by the gate driving signal output unit, the gate driving signal output end to output the low level under the control of the pull-down node, and enabling, by the carry signal output unit, the carry signal output end to output the low level under the control of the pull-down node. At the input stage and the pull-down stage, the second clock signal is at the low level, and at the output stage, the second clock signal is at the high level.

To be specific, a duty ratio of the first clock signal and a duty ratio of the second clock signal are each 0.25. A duration of the input stage, a duration of the output stage and a duration of the pull-down stage are each one time unit. The first clock signal is delayed by two time units as compared with the second clock signal.

The present disclosure further provides in some embodiments a gate driver circuit, which includes multiple levels of the above-mentioned shift register units. The shift register units at odd-numbered levels are arranged at a left side of a display panel and the shift register units at even-numbered levels are arranged at a right side of the display panel, or the shift register units at even-numbered levels are arranged at the left side of the display panel and the shift register units at odd-numbered levels are arranged at the right side of the display panel.

According to the gate driver circuit in the embodiments of the present disclosure, the shift register units are arranged alternately at the left side and the right side of the display panel, so as to further reduce a size of a bezel of the display panel, thereby to facilitate the design of a high-resolution display product.

The present disclosure further provides in some embodiments a gate driver circuit which includes multiple levels of the above-mentioned shift register units. A second clock signal input end of an $(8n-7)^{th}$-level shift register unit is configured to receive a first left-side clock signal CK1L or a first right-side clock signal CK1R; a second clock signal input end of an $(8n-5)^{th}$-level shift register unit is configured to receive a second left-side clock signal CK2L or a second right-side clock signal CK2R; a first clock signal input end of the $(8n-7)^{th}$-level shift register unit is configured to a third left-side clock signal CK3L or a third right-side clock signal CK3R; a first clock signal input end of the $(8n-5)^{th}$ shift register unit is configured to receive a fourth left-side clock signal CK4L or a fourth right-side clock signal CK4R; a second clock signal input end of an $(8n-6)^{th}$-level shift register unit is configured to receive the first right-side clock signal CK1R or the first left-side clock signal CK1L; a second clock signal input end of an $(8n-4)^{th}$-level shift register unit is configured to receive the second right-side clock signal CK2R or the second left-side clock signal CK2L; a first clock signal input end of the $(8n-6)^{th}$-level shift register unit is configured to the third right-side clock signal CK3R or the third left-side clock signal CK3L; a first clock signal input end of the $(8n-4)^{th}$-level shift register unit is configured to receive the fourth right-side clock signal CK4R or the fourth left-side clock signal CK4L; a second clock signal input end of an $(8n-3)^{th}$-level shift register unit is configured to receive the third left-side clock signal CK3L or the third right-side clock signal CK3R; a second clock signal input end of an $(8n-1)^{th}$-level shift register unit is configured to receive the fourth left-side clock signal CK4L or the fourth right-side clock signal CK4R; a first clock signal input end of the $(8n-3)^{th}$-level shift register unit is configured to receive the first left-side clock signal CK1L or the first right-side clock signal CK1R; a first clock signal input end of the $(8n-1)^{th}$-level shift register unit is configured to receive the second left-side clock signal CK2L or the second right-side clock signal CK2R; a second clock signal input end of an $(8n-2)^{th}$-level shift register unit is configured to receive the third right-side clock signal CK3R or the third left-side clock signal CK3L; a second clock signal input end of an $(8n)^{th}$-level shift register unit is configured to receive the fourth right-side clock signal CK4R or the fourth left-side clock signal CK4L; a first clock signal input end of the $(8n-2)^{th}$-level shift register unit is configured to receive the first right-side clock signal CK1R or the first left-side clock signal CK1L; and a first clock signal input end of the $(8n)^{th}$-level shift register unit is configured to receive the second right-side clock signal CK2R or the second left-side clock signal CK2L, where n is a positive integer.

Figure 10:
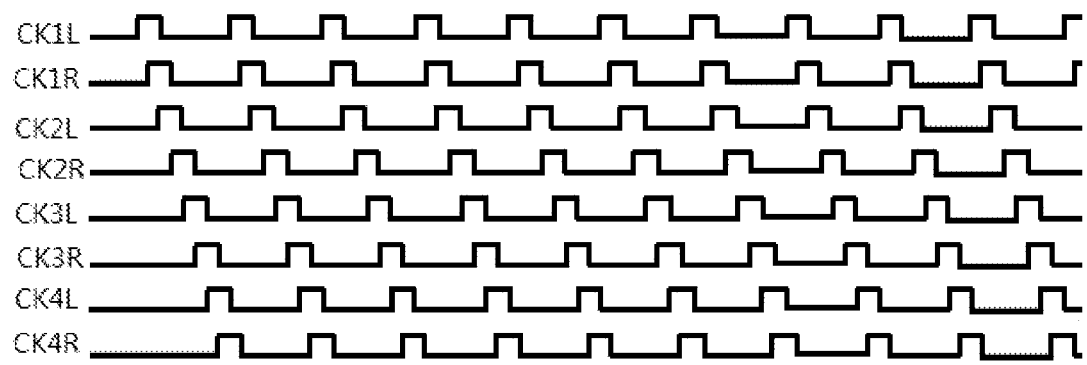
FIG. 10 is a waveform diagram of eight clock signals applied to a gate driver circuit according to one embodiment of the present disclosure.

As shown in FIG. 10, the second left-side clock signal CK2L is delayed by one time unit as compared with the first left-side clock signal CK1L, the third left-side clock signal CK3L is delayed by one time unit as compared with the second left-side clock signal CK2L, and the fourth left-side clock signal CK4L is delayed by one time unit as compared with the third left-side clock signal CK3L. The second right-side clock signal CK2R is delayed by one time unit as compared with the first right-side clock signal CK1R, the third right-side clock signal CK3R is delayed by one time unit as compared with the second right-side clock signal CK2R, and the fourth right-side clock signal CK4R is delayed by one time unit as compared with the third right-side clock signal CK3R. The first right-side clock signal CK1R is delayed by 0.5 time unit as compared with the first left-side clock signal CK1L. Each clock signal has a duty ratio of 0.25, and all clock signal are maintained at the high level for one time unit. Apart from a first-level shift register unit on the left, a first carry signal input end of a current-level shift register unit on the left is connected to a carry signal output end of an adjacent previous-level shift register unit on the left. Apart from a first-level shift register unit on the right, a first carry signal input end of a current-level shift register unit on the right is connected to a carry signal output end of an adjacent previous-level shift register unit on the right. Apart from a last-level shift register unit on the left, a second carry signal input end of a current-level shift register unit on the left is connected to a carry signal output end of an adjacent next-level shift register unit on the left. Apart from a last-level shift register unit on the right, a second carry signal input end of a current-level shift register unit on the right is connected to a carry signal output end of an adjacent next-level shift register unit on the right.

The gate driver circuit in the embodiments of the present disclosure is based on an 8-phase clock driving mode (i.e., it uses 8 clock signals), so it is able to pre-charge the next-level shift register unit in the case that the current-level shift register unit is outputting the gate driving signal at a high level, thereby to reduce the power consumption of the entire gate driver circuit.

The gate driver circuit in the embodiments of the present disclosure will be described hereinafter in conjunction with one embodiment.

Figure 11:
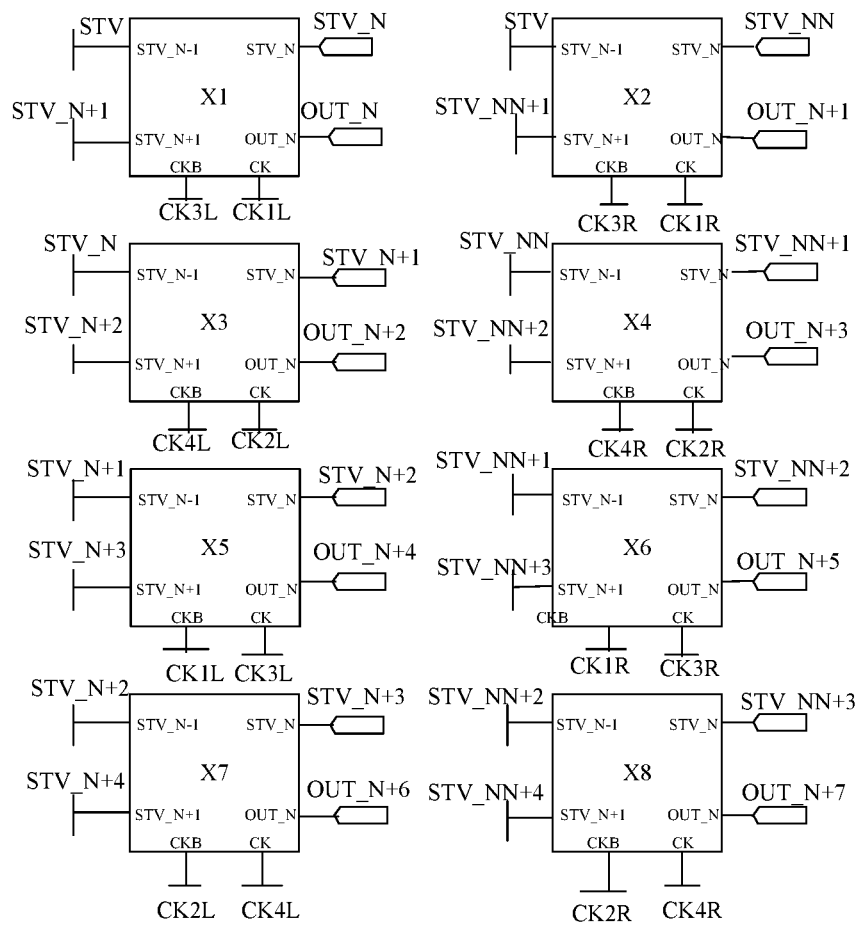
FIG. 11 is a schematic view showing the gate driver circuit according to one embodiment of the present disclosure.

As shown in FIG. 11, the gate driver circuit includes a first-level shift register unit X1, a second-level shift register unit X2, a third-level shift register unit X3, a fourth-level shift register unit X4, a fifth-level shift register unit X5, a sixth-level shift register unit X6, a seventh-level shift register unit X7, an eighth-level shift register unit X8 and a ninth-level shift register unit (not shown). X1, X3, X5 and X7 are arranged at the left side of the display panel, and X2, X4, X6 and X8 are arranged at the right side of the display panel.

A second clock signal input end CK of X1 is configured to receive the first left-side clock signal CK1L, and a first clock signal input end CKB of X1 is configured to receive the third left-side clock signal CK3L. A second clock signal input end CK of X2 is configured to receive the first right-side clock signal CK1R, and a first clock signal input end CKB of X2 is configured to receive the third right-side clock signal CK3R. A second clock signal input end CK of X3 is configured to receive the second left-side clock signal CK2L, and a first clock signal input end CKB of X3 is configured to receive the fourth left-side clock signal CK4L. A second clock signal input end CK of X4 is configured to receive the second right-side clock signal CK2R, and a first clock signal input end CKB of X4 is configured to receive the fourth right-side clock signal CK4R. A second clock signal input end CK of X5 is configured to receive the third left-side clock signal CK3L, and a first clock signal input end CKB of X5 is configured to receive the first left-side clock signal CK1L. A second clock signal input end CK of X6 is configured to receive the third right-side clock signal CK3R, and a first clock signal input end CKB of X6 is configured to receive the first right-side clock signal CK1R. A second clock signal input end CK of X7 is configured to receive the fourth left-side clock signal CK4L, and a first clock signal input end CKB of X7 is configured to receive the second left-side clock signal CK2L. A second clock signal input end CK of X8 is configured to receive the fourth right-side clock signal CK4R, and a first clock signal input end CKB of X8 is configured to receive the second right-side clock signal CK2R.

A first start signal input end of X1 is configured to receive a start signal STV, and a first start signal input end of X2 is configured to receive the start signal STV too. A second start signal input end of X1 is connected to a carry signal output end STV_N+1 of X3. A first start signal input end of X3 is connected to a carry signal output end STV_N of X1, and a second start signal input end of X3 is connected to a carry signal output end STV_N+2 of X5. A first start signal input end of X5 is connected to the carry signal output end STV_N+1 of X3, and a second start signal input end of X5 is connected to a carry signal output end STV_N+3 of X7. A first start signal input end of X7 is connected to the carry signal output end STV_N+2 of X5, and a second start signal input end of X7 is connected to a carry signal output end STV_N+4 of the ninth-level shift register unit. A second start signal input end of X2 is connected to a carry signal output end STV_NN+1 of X4. A first start signal input end of X4 is connected to a carry signal output end STV_NN of X2, and a second start signal input end of X4 is connected to a carry signal output end STV_NN+2 of X6. A first start signal input end of X6 is connected to the carry signal output end STV_NN+1 of X4, and a second start signal input end of X6 is connected to a carry signal output end STV_NN+3 of X8. A first start signal input end of X8 is connected to the carry signal output end STV_NN+2 of X6, and a second start signal input end of X8 is connected to a carry signal output end STV_NN+4 of the ninth-level shift register unit.

A gate driving signal output end of X1 is represented by OUT_N, a gate driving signal output end of X2 is represented by OUT_N+1, a gate driving signal output end of X3 is represented by OUT_N+2, a gate driving signal output end of X4 is represented by OUT_N+3, a gate driving signal output end of X5 is represented by OUT_N+4, a gate driving signal output end of X6 is represented by OUT_N+5, a gate driving signal output end of X7 is represented by OUT_N+6, and a gate driving signal output end of X8 is represented by OUT_N+7.

Figure 12:
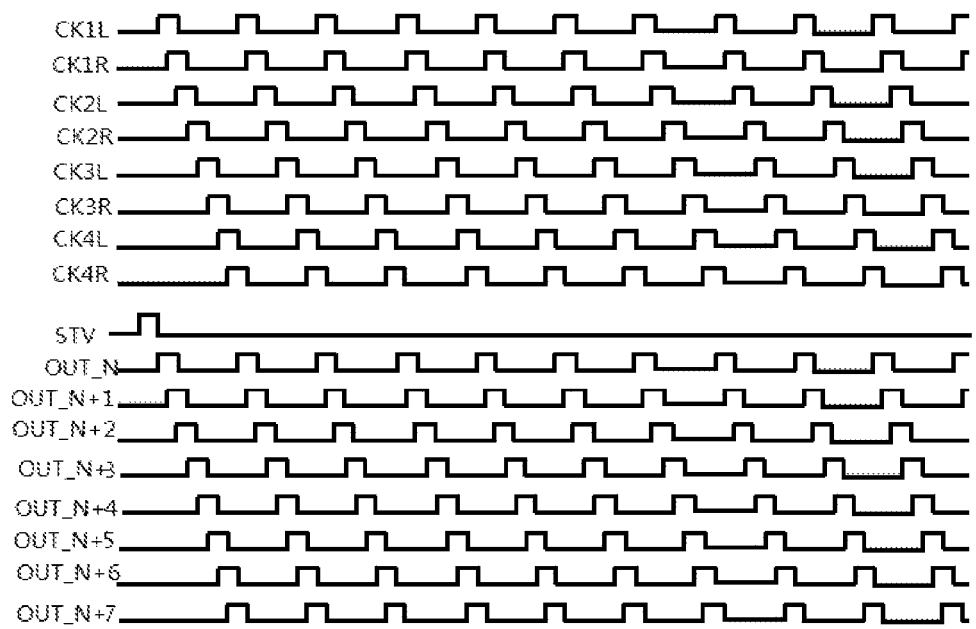
FIG. 12 is a time sequence diagram of the gate driver circuit according to one embodiment of the present disclosure.

As shown in FIG. 12, the second left-side clock signal CK2L is delayed by one time unit as compared with the first left-side clock signal CK1L, the third left-side clock signal CK3L is delayed by one time unit as compared with the second left-side clock signal CK2L, and the fourth left-side clock signal CK4L is delayed by one time unit as compared with the third left-side clock signal CK3L. The second right-side clock signal CK2R is delayed by one time unit as compared with the first right-side clock signal CK1R, the third right-side clock signal CK3R is delayed by one time unit as compared with the second right-side clock signal CK2R, and the fourth right-side clock signal CK4R is delayed by one time unit as compared with the third right-side clock signal CK3R. The first right-side clock signal CK1R is delayed by 0.5 time unit as compared with the first left-side clock signal CK1L. Each clock signals has a duty ratio of 0.25, and is maintained at a high level for one time unit.

As shown in FIG. 12, which is a waveform diagram of the signals from the gate driving signal output ends of X1-X8, the gate driving signal from the current-level shift register unit is delayed by 0.5 time unit as compared with the gate driving signal from the next-level shift register unit, i.e., the next-level shift register unit has started to be pre-charged and output the gate driving signal in the case that the current-level shift register unit is outputting the gate driving signal at the high level, so it is able to reduce the power consumption of the entire gate driver circuit.

The gate driver circuit in this embodiment of the present disclosure includes multiple levels of the above-mentioned shift register units. The shift register units at odd-numbered levels are arranged at the left side of the display panel and the shift register units at even-numbered levels are arranged at the right side of the display panel. A second clock signal input end of an $(8n-7)^{th}$-level shift register unit is configured to receive a first right-side clock signal; a second clock signal input end of an $(8n-5)^{th}$-level shift register unit is configured to receive a second right-side clock signal; a first clock signal input end of the $(8n-7)^{th}$-level shift register unit is configured to a third right-side clock signal; a first clock signal input end of the $(8n-5)^{th}$ shift register unit is configured to receive a fourth right-side clock signal; a second clock signal input end of an $(8n-6)^{th}$-level shift register unit is configured to receive a first left-side clock signal; a second clock signal input end of an $(8n-4)^{th}$-level shift register unit is configured to receive a second left-side clock signal; a first clock signal input end of the $(8n-6)^{th}$-level shift register unit is configured to a third left-side clock signal; a first clock signal input end of the $(8n-4)^{th}$-level shift register unit is configured to receive a fourth left-side clock signal; a second clock signal input end of an $(8n-3)^{th}$-level shift register unit is configured to receive the third right-side clock signal; a second clock signal input end of an $(8n-1)^{th}$-level shift register unit is configured to receive the fourth right-side clock signal; a first clock signal input end of the $(8n-3)^{th}$-level shift register unit is configured to receive the first right-side clock signal; a first clock signal input end of the $(8n-1)^{th}$-level shift register unit is configured to receive the second right-side clock signal; a second clock signal input end of an $(8n-2)^{th}$-level shift register unit is configured to receive the third left-side clock signal; a second clock signal input end of an $(8n)^{th}$-level shift register unit is configured to receive the fourth left-side clock signal; a first clock signal input end of the $(8n-2)^{th}$-level shift register unit is configured to receive the first left-side clock signal; and a first clock signal input end of the $(8n)^{th}$-level shift register unit is configured to receive the second left-side clock signal, where n is a positive integer. The second left-side clock signal is delayed by one time unit as compared with the first left-side clock signal, the third left-side clock signal is delayed by one time unit as compared with the second left-side clock signal, and the fourth left-side clock signal is delayed by one time unit as compared with the third left-side clock signal. The second right-side clock signal is delayed by one time unit as compared with the first right-side clock signal, the third right-side clock signal is delayed by one time unit as compared with the second right-side clock signal, and the fourth right-side clock signal is delayed by one time unit as compared with the third right-side clock signal. The first left-side clock signal is delayed by 0.5 time unit as compared with the first right-side clock signal. Each clock signal has a duty ratio of 0.25, and each clock signal is maintained at the high level for one time unit. Apart from a first-level shift register unit on the left, a first carry signal input end of a current-level shift register unit on the left is connected to a carry signal output end of an adjacent previous-level shift register unit on the left. Apart from a first-level shift register unit on the right, a first carry signal input end of a current-level shift register unit on the right is connected to a carry signal output end of an adjacent previous-level shift register unit on the right. Apart from a last-level shift register unit on the left, a second carry signal input end of a current-level shift register unit on the left is connected to a carry signal output end of an adjacent next-level shift register unit on the left. Apart from a last-level shift register unit on the right, a second carry signal input end of a current-level shift register unit on the right is connected to a carry signal output end of an adjacent next-level shift register unit on the right.

The gate driver circuit in this embodiment of the present disclosure differs from the gate driver circuit in FIG. 11 in that the shift register units at the even-numbered levels are arranged at the left side of the display panel, while the shift register units at the odd-numbered levels are arranged at the right side of the display panel. An operation procedure of the gate driver circuit in this embodiment of the present disclosure is identical to that in FIG. 11, i.e, a next-level shift register unit has started to be pre-charged and output the gate driving signal in the case that a current-level shift register unit is outputting the gate driving signal at a high level, so it is able to reduce the power consumption of the entire gate driver circuit.

The present disclosure further provides in some embodiments a display device including a display panel and the above-mentioned gate driver circuit.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A shift register unit, comprising a gate driving signal output end, a carry signal output end, a first clock signal input end, and a carry signal input end, wherein the shift register unit further comprises:
   a first pull-up node control unit connected to a pull-up node and the carry signal input end;
   a second pull-up node control unit connected to the pull-up node and the first clock signal input end, and configured to enable the pull-up node to be at a first level at a pull-down maintenance stage under the control of a first clock signal;
   a first pull-down node control unit connected to a pull-down node and the first clock signal input end, and configured to enable the pull-down node to be at a second level at the pull-down maintenance stage under the control of the first clock signal;
   a second pull-down node control unit connected to the pull-up node and the pull-down node, and configured to enable the pull-down node to be at the first level when the pull-up node is at the second level;
   a gate driving signal output unit connected to the pull-up node, the pull-down node and the gate driving signal output end, and configured to enable the gate driving signal output end to output a gate driving signal under the control of the pull-up node and the pull-down node; and
   a carry signal output unit connected to the pull-up node, the pull-down node and the carry signal output end, and configured to enable the carry signal output end to output a carry signal under the control of the pull-up node and the pull-down node.

2. The shift register unit according to claim 1, wherein the first pull-up node control unit is configured to enable the pull-up node to be at the second level at an input stage under the control of the carry signal, and maintain the pull-up node at the second level at an output stage.

3. The shift register unit according to claim 1, wherein the carry signal input end comprises a first carry signal input end and a second carry signal input end;
   during forward scanning, the first carry signal input end is connected to a carry signal output end of an adjacent previous-level shift register unit; and
   during backward scanning, the second carry signal input end is connected to a carry signal output end of an adjacent next-level shift register unit.

4. The shift register unit according to claim 3, wherein the first pull-up node control unit comprises:
   a first input module connected to the pull-up node and connected to the carry signal output end of the adjacent previous-level shift register unit via the first carry signal input end, and configured to, during the forward scanning, enable the pull-up node to be at the second level at an input stage under the control of a first carry signal; and
   a second input module connected to the pull-up node, and connected to the carry signal output end of the adjacent next-level shift register unit via the second carry signal input end, and configured to, during the backward scanning, enable the pull-up node to be at the second level at the input stage under the control of a second carry signal.

5. The shift register unit according to claim 4, wherein the first input module comprises a first transistor, a gate electrode and a first electrode of the first transistor are connected to the carry signal output end of the adjacent previous-level shift register unit via the first carry signal input end, and a second electrode of the first transistor is connected to the pull-up node, and
   the second input module comprises a second transistor, a gate electrode and a second electrode of the second transistor are connected to the carry signal output end of the adjacent next-level shift register unit via the second carry signal input end, and a first electrode of the second transistor is connected to the pull-up node.

6. The shift register unit according to claim 4, wherein the first pull-up node control unit further comprises: a first storage capacitor, a first end of the first storage capacitor is connected to the pull-up node, and a second end of the first storage capacitor is connected to the gate driving signal output end; and/or a second storage capacitor, a first end of the second storage capacitor is connected to the pull-up node, and a second end of the second storage capacitor is connected to the carry signal output end.

7. The shift register unit according to claim 1, wherein the first clock signal is at the second level within a time period at a very beginning of the pull-down maintenance stage, then the first clock signal is to be at the second level each time after a predetermined interval, and at the first level within the predetermined interval.

8. The shift register unit according to claim 7, further comprising a second clock signal input end, wherein the gate driving signal output unit is further configured to receive the first level, connected to the second clock signal input end, and configured to enable the gate driving signal output end to output a second clock signal at an input stage, an output stage and a pull-down stage under the control of the pull-up node, and enable the gate driving signal output end to output the first level at the pull-down maintenance stage under the control of the pull-down node;

the carry signal output unit is further configured to receive the first level, connected to the second clock signal input end, and configured to enable the carry signal output end to output the second clock signal at the input stage, the output stage and the pull-down stage under the control of the pull-up node, and enable the carry signal output end to output the first level at the pull-down maintenance stage under the control of the pull-down node; and at the input stage and the pull-down stage, the second clock signal is at the first level, and at the output stage, the second clock signal is at the second level.

9. The shift register unit according to claim 8, wherein a duty ratio of the first clock signal and a duty ratio of the second clock signal are each 0.25;

a duration of the input stage, a duration of the output stage and a duration of the pull-down stage are each one time unit; and the first clock signal is delayed by two time units as compared with the second clock signal.

10. The shift register unit according to claim 9, wherein the predetermined interval is three time units.

11. The shift register unit according to claim 1, wherein the first level is a low level and the second level is a high level, or the first level is a high level and the second level is a low level.

12. The shift register unit according to claim 1, wherein the second pull-up node control unit is further connected to the pull-down node, and configured to enable the pull-up node to be at the first level when the pull-down node is at the second level.

13. The shift register unit according to claim 12, wherein the second pull-up node control unit comprises: a third transistor, a gate electrode of the third transistor is connected to the first clock signal input end, a first electrode of the third transistor is connected to the pull-up node, and a second electrode of the third transistor is configured to receive the first level; and a fourth transistor, a gate electrode of the fourth transistor is connected to the pull-down node, a first electrode of the fourth transistor is connected to the pull-up node, and a second electrode of the fourth transistor is configured to receive the first level.

14. The shift register unit according to claim 1, wherein the first pull-down node control unit comprises a fifth transistor, a gate electrode and a first electrode of the fifth transistor is connected to the first clock signal input end, and a second electrode of the fifth transistor is connected to the pull-down node.

15. The shift register unit according to claim 1, wherein the second pull-down node control unit is further connected to the carry signal output end of the adjacent next-level shift register unit, and further configured to enable the pull-down node to be at the first level when the carry signal output end of the adjacent next-level shift register unit outputs the second level.

16. The shift register unit according to claim 15, wherein the second pull-down node control unit comprises: a sixth transistor, a gate electrode of the sixth transistor is connected to the carry signal output end of an adjacent next-level shift register unit via a second carry signal input end, a first electrode of the sixth transistor is connected to the pull-down node, and a second electrode of the sixth transistor is configured to receive the first level; and a seventh transistor, a gate electrode of the seventh transistor is connected to the pull-up node, a first electrode of the seventh transistor is connected to the pull-down node, and a second electrode is configured to receive the first level.

17. The shift register unit according to claim 1, wherein the gate driving signal output unit comprises: a first gate driving signal outputting transistor, a gate electrode of the first gate driving signal outputting transistor is connected to the pull-up node, a first electrode of the first gate driving signal outputting transistor is connected to a second clock signal input end, and a second electrode of the first gate driving signal outputting transistor is connected to the gate driving signal output end; and a second gate driving signal outputting transistor, a gate electrode of the second gate driving signal outputting transistor is connected to the pull-down node, a first electrode of the second gate driving signal outputting transistor is connected to the gate driving signal output end, and a second electrode of the second gate driving signal outputting transistor is configured to receive the first level; and the carry signal output unit comprises: a first carry signal outputting transistor, a gate electrode of the first carry signal outputting transistor is connected to the pull-up node, a first electrode of the first carry signal outputting transistor is connected to the second clock signal input end, and a second electrode of the first carry signal outputting transistor is connected to the carry signal output end; and a second carry signal outputting transistor, a gate electrode of the second carry signal outputting transistor is connected to the pull-down node, a first electrode of the second carry signal outputting transistor is connected to the carry signal output end, and a second electrode of the second carry signal outputting transistor is configured to receive the first level.

18. A gate driver circuit, comprising multiple levels of the shift register units according to claim 1, wherein the shift register units at odd-numbered levels are arranged at a left side of a display panel and the shift register units at even-numbered levels are arranged at a right side of the display panel, or the shift register units at even-numbered levels are arranged at the left side of the display panel and the shift register units at odd-numbered levels are arranged at the right side of the display panel.

19. A method for driving a shift register unit, comprising steps of:

at an input stage, enabling, by a second pull-down node control unit, a pull-down node to be at a first level under the control of a pull-up node, and enabling, by a first pull-up node control unit, the pull-up node to be at a second level;

at an output stage, enabling, by the first pull-up node control unit, the pull-up node to be maintained at the second level, and enabling, by the second pull-down node control unit, the pull-down node to be at the first level under the control of the pull-up node;

at a pull-down stage, enabling the pull-up node to be maintained at the second level, and enabling, by the second pull-down node control unit, the pull-down node to be at the first level under the control of the pull-up node; and at a pull-down maintenance stage, enabling, by a second pull-up node control unit, the pull-up node to be at the first level under the control of a first clock signal, and enabling, by a first pull-down node control unit, the pull-down node to be at the second level under the control of the first clock signal.

20. A gate driver circuit, comprising multiple levels of shift register units, wherein a second clock signal input end of an $(8n-7)^{th}$-level shift register unit is configured to receive a first left-side clock signal or a first right-side clock signal;

a second clock signal input end of an $(8n-5)^{th}$-level shift register unit is configured to receive a second left-side clock signal or a second right-side clock signal;

a first clock signal input end of the $(8n-7)^{th}$-level shift register unit is configured to a third left-side clock signal or a third right-side clock signal;

a first clock signal input end of the $(8n-5)^{th}$ shift register unit is configured to receive a fourth left-side clock signal or a fourth right-side clock signal;

a second clock signal input end of an $(8n-6)^{th}$-level shift register unit is configured to receive the first right-side clock signal or the first left-side clock signal;

a second clock signal input end of an $(8n-4)^{th}$-level shift register unit is configured to receive the second right-side clock signal or the second left-side clock signal;

a first clock signal input end of the $(8n-6)^{th}$-level shift register unit is configured to the third right-side clock signal or the third left-side clock signal;

a first clock signal input end of the $(8n-4)^{th}$-level shift register unit is configured to receive the fourth right-side clock signal or the fourth left-side clock signal;

a second clock signal input end of an $(8n-3)^{th}$-level shift register unit is configured to receive the third left-side clock signal or the third right-side clock signal;

a second clock signal input end of an $(8n-1)^{th}$-level shift register unit is configured to receive the fourth left-side clock signal or the fourth right-side clock signal;

a first clock signal input end of the $(8n-3)^{th}$-level shift register unit is configured to receive the first left-side clock signal or the first right-side clock signal;

a first clock signal input end of the $(8n-1)^{th}$-level shift register unit is configured to receive the second left-side clock signal or the second right-side clock signal;

a second clock signal input end of an $(8n-2)^{th}$-level shift register unit is configured to receive the third right-side clock signal or the third left-side clock signal;

a second clock signal input end of an $(8n)^{th}$-level shift register unit is configured to receive the fourth right-side clock signal or the fourth left-side clock signal;

a first clock signal input end of the $(8n-2)^{th}$-level shift register unit is configured to receive the first right-side clock signal or the first left-side clock signal;

a first clock signal input end of the $(8n)^{th}$-level shift register unit is configured to receive the second right-side clock signal or the second left-side clock signal;

n is a positive integer;

the second left-side clock signal is delayed by one time unit as compared with the first left-side clock signal, the third left-side clock signal is delayed by one time unit as compared with the second left-side clock signal, and the fourth left-side clock signal is delayed by one time unit as compared with the third left-side clock signal;

the second right-side clock signal is delayed by one time unit as compared with the first right-side clock signal, the third right-side clock signal is delayed by one time unit as compared with the second right-side clock signal, and the fourth right-side clock signal is delayed by one time unit as compared with the third right-side clock signal;

the first right-side clock signal is delayed by 0.5 time unit as compared with the first left-side clock signal;

each clock signal has a duty ratio of 0.25, and each clock signal is maintained at the first level for three time units and at the second level for one time unit;

apart from a first-level shift register unit on the left, a first carry signal input end of a current-level shift register unit on the left is connected to a carry signal output end of an adjacent previous-level shift register unit on the left;

apart from a first-level shift register unit on the right, a first carry signal input end of a current-level shift register unit on the right is connected to a carry signal output end of an adjacent previous-level shift register unit on the right;

apart from a last-level shift register unit on the left, a second carry signal input end of a current-level shift register unit on the left is connected to a carry signal output end of an adjacent next-level shift register unit on the left; and apart from a last-level shift register unit on the right, a second carry signal input end of a current-level shift register unit on the right is connected to a carry signal output end of an adjacent next-level shift register unit on the right.

* * * * *